United States Patent [19]

Hiromi

[11] Patent Number: 5,680,268
[45] Date of Patent: Oct. 21, 1997

[54] APPARATUS FOR MAGNETIC RECORDING AND PLAYBACK HAVING A RECORDING/PLAYBACK COIL SPLIT BY A CENTER TAP AND SUPPLYING AN UNBALANCED WRITE CURRENT

[75] Inventor: Mitsuhisa Hiromi, Tokyo, Japan

[73] Assignee: NEC Corporation, Tokyo, Japan

[21] Appl. No.: 619,150

[22] Filed: Mar. 21, 1996

Related U.S. Application Data

[63] Continuation of Ser. No. 317,771, Oct. 4, 1994.

[30] Foreign Application Priority Data

Oct. 12, 1993 [JP] Japan ................. 5-254104

[51] Int. Cl.$^6$ ................. G11B 5/03; G11B 5/09
[52] U.S. Cl. ................. 360/66; 360/46
[58] Field of Search ................. 360/46, 61, 66, 360/67, 68, 65

[56] References Cited

U.S. PATENT DOCUMENTS

| | | | |
|---|---|---|---|
| 4,110,804 | 8/1978 | Castrodale et al. | 360/121 |
| 4,787,002 | 11/1988 | Isozaki | 360/66 |
| 4,845,573 | 7/1989 | Hardeng | 360/60 |
| 5,280,196 | 1/1994 | Shinozaki | 360/46 |
| 5,282,094 | 1/1994 | Ngo | 360/46 |

FOREIGN PATENT DOCUMENTS

| | | | |
|---|---|---|---|
| 52-46807 | 4/1977 | Japan | 360/46 |
| 63-44308 | 2/1988 | Japan. | |
| 1-263904 | 10/1989 | Japan. | |

*Primary Examiner*—Aristotelis M. Psitos
*Assistant Examiner*—Regina Y. Neal

[57] ABSTRACT

A magnetic head drive circuit connected to a magnetic recording/playback head is supplied with an unbalanced write current. The drive circuit includes a recording/playback coil divided by a center tap into a first coil and a second coil. A high level of a value lower than the high level of a control signal of an input terminal IN3 is impressed to one of a control signal of input terminals IN1 and IN2 and a low level is impressed to the other so that a direction is determined of a write current supplied to the recording/playback coil from a current source composed of a current mirror made up from NPN bipolar transistors and resistors. The balanced/unbalanced switching of the supplied write current is performed by switching the voltage level impressed to control signal input terminal IN3 using an NPN bipolar transistor as a switching unit.

8 Claims, 5 Drawing Sheets

1

APPARATUS FOR MAGNETIC RECORDING AND PLAYBACK HAVING A RECORDING/ PLAYBACK COIL SPLIT BY A CENTER TAP AND SUPPLYING AN UNBALANCED WRITE CURRENT

This is a continuation of application Ser. No. 08/317,771, filed Oct. 4, 1994.

BACKGROUND OF THE INVENTION

1. Field of the Invention

The present invention relates to an apparatus for magnetic recording and playback such as a floppy disk drive and particularly to a magnetic head drive circuit.

2. Description of the Related Art

Inventions of the prior art relating to magnetic head drive circuits include inventions of a magnetic head disclosed in Japanese Patent Laid-open No. 44308/88 and a magnetic head apparatus disclosed in Japanese Patent Laid-open No. 263904/89. The drive circuits disclosed in these publications are typical examples of the prior art for this type in which the above-described circuits are constructed such that write currents supplied from a single current source to each of the divided coils of the recording/playback coil are unbalanced, and flux leaking from the erase head is compensated.

FIG. 3 is a circuit diagram of the magnetic head drive circuit in an example of the prior art in which the circuits disclosed in the above publications are redrawn to correspond to the present invention. The circuit of FIG. 3 is a construction including a magnetic recording/playback head 31, NPN bipolar transistors $Q_{31}$, $Q_{32}$ which determine the direction of the current that flows to the magnetic recording/playback head 31, and a current source constructed as a current mirror by NPN bipolar transistors $Q_{33}$, $Q_{34}$ and resistors $R_{31}$, $R_{32}$ that supplies current flowing to the recording/playback coil 32. The current source constructed as the current mirror is connected to drive voltage source Vcc. The base of transistor $Q_{31}$ is connected to the control signal input terminal IN1, and the base of transistor $Q_{32}$ is connected to the control signal input terminal IN2. In this magnetic head drive circuit of the example of the prior art, because the current outputted to the recording/playback coil 32 is determined by the collector current of $Q_{34}$, the same amount of current is outputted to the recording/playback coil 32 regardless of the direction of the current flowing to the recording/playback coil 32.

When this type of magnetic head drive circuit of the prior art is connected to a magnetic recording/playback head to record or play back, one source of read errors that occur is peak shift. Peak shift is a phenomenon in which, due to a variety of causes, the peaks in the playback waveform shift position. One cause of peak shift is bit asymmetry caused by leakage in the erase magnetic field. This bit asymmetry is illustrated in FIG. 4. Here, A1 and B1 are recorded magnetization patterns, A2 and B2 are voltage waveforms that appear in the magnetic recording/playback head at the time of playback, and A3 and B3 are read data pulses obtained from A2 and B2, respectively. FIG. 4A shows the ideal magnetization patterns recorded at a fixed frequency and their playback waveforms. However, in the case of leakage of the erase magnetic field, the positions of the peaks of the playback waveform shift as shown in FIG. 4B. Here, assuming the direction of the leaking erase magnetic field is from left to right, if the direction of magnetization is from left to right as shown in B1 of FIG. 4B, the magnetization patterns become longer because magnetization is in the same direc-

2 tion as the erase magnetic field, but the magnetic zation patterns become shorter when the direction of magnetization is from right to left because magnetization is in the opposite direction of the erase magnetic field. The permissible amount of such peak shift is determined by the data window, and when the peak shift is greater than the permissible amount, read errors are generated.

As a measure against peak shift caused by bit asymmetry, there is a method by which the size of the impressed magnetic field is varied according to the direction of magnetization. Varying the size of the magnetic field can be achieved by varying the amount of the write current, but the amount of write currents supplied to the two sides of the recording/playback coil from a magnetic head drive circuit of the prior art are the same. For this reason, in the method shown in FIG. 5, the amount of write current is varied and set so as to be out of balance. FIG. 5 illustrates a method of supplying an unbalanced write current in a case using a magnetic head drive circuit of the prior art. The magnetic recording/playback head 51, recording/playback coil 52, and magnetic head drive circuit 53 shown in the figure correspond to the magnetic head drive circuit shown in FIG. 3. In the method shown in FIG. 5, an unbalanced characteristic is provided in the write current by connecting a separate outside circuit to the magnetic recording/playback head 51 and magnetic head drive circuit 53. In FIG. 5, an equal current I is supplied regardless of the direction of the current flowing to the recording/playback coil 52 from the magnetic head drive circuit 53. However, because current $\Delta I$ flows through resistor $R_{51}$, the current flowing to the left portion of the recording/playback coil 52 is I, but the current flowing to the right portion of the recording/playback coil 52 is $(I-\Delta I)$, and the write current flowing to recording/playback coil 52 is unbalanced. The variation $\Delta I$ in the unbalanced write current can be represented by:

$$\Delta I/I = r_{SL}/(r_{SL} + r_{S1}) \qquad 1$$

if the resistance of the right portion of the recording/playback coil 52 is $R_{SL}$, and the resistance values of $R_{51}$ and $R_{5L}$ are $r_{51}$ and $r_{5L}$, respectively.

Due to the current advance in integration of circuits such as for processing of signals such as for recording/playback, the above-described magnetic head drive circuit of the prior art is constructed as one read/write IC. Nevertheless, the necessity for a separate outside circuit to provide an unbalanced characteristic in the write current results in an increase in the number of parts, thereby preventing a reduction in the size of an apparatus and increasing the number of assembly steps.

SUMMARY OF THE INVENTION

In view of these facts, the first object of the present invention is to realize a magnetic head drive circuit that can determine and supply an unbalanced write current with a high degree of accuracy without connecting a separate outside circuit, thereby enabling a reduction in size and a reduction of the number of assembly steps of a magnetic recording/playback apparatus of such devices as a floppy disk drive. This object allows setting an unbalanced characteristic of the write current with a high degree of accuracy by supplying an unbalanced write current to the recording/playback coil of a magnetic recording/playback head having a recording/playback coil split by a center tap and supplying this write current by means of a current source having a current mirror circuit.

A second object of the present invention is to realize a circuit whereby a balanced write current can also be determined and supplied, this circuit allowing interchangeability with a magnetic head drive circuit of the prior art which supplies an unbalanced write current through connection of a separate outside circuit. According to this object, by providing a switching means that can turn off a current source that supplies an unbalanced write current, a write current can be established with a balanced characteristic.

To achieve the above objects, the magnetic head drive circuit of the present invention includes: a magnetic recording/playback head provided with a recording/playback coil divided by a center tap into a first coil and a second coil; a first current source for supplying a write current to the recording/playback coil; first switching means and second switching means connected between the current output terminal of the first current source and the first and second coils, respectively, for switching the direction of a write current; a second current source for supplying a current to the first coil; third switching means connected between the first coil and the current output terminal of the second current source; and fourth switching means connected between an electrode of a drive voltage source connected to the center tap and the current output terminal of the second current source; the third and fourth switching means being switched on and off simultaneously with the first and second switching means, respectively.

The above-described magnetic head drive circuit of the present invention can be provided with fifth switching means connected between an electrode of the drive voltage source connected to the center tap of the recording/playback coil and the current output terminal of the second current source, and in such a case, when the fifth switching means is off, the third and fourth switching means are switched on and off simultaneously with the first and second switching means, respectively, and when the fifth switching means is on, the third and fourth switching means are switched off.

Further, in the above-described magnetic head drive circuit of the present invention, the first to fifth switching means can all be provided with semiconductor switching elements, and the first and second current sources can be provided with a first current mirror circuit and a second mirror circuit, respectively, that share a current input circuit.

Here, the first to fifth switching means can all be provided with NPN bipolar transistors or N-channel MOS transistors. In these cases, the first and third switching means can be on/off controlled by a first control signal, and the second and fourth switching means can be on/off controlled by a second control signal, and the fifth switching means can be on/off controlled by a third control signal, the high level of the third control signal being set at a higher value than the high levels of the first and second control signals.

The magnetic recording/playback apparatus of the present invention is a device in which a generally known magnetic recording/playback head is driven by the above-described magnetic head drive circuit of the present invention.

In a magnetic head drive circuit constructed as described above, when the first switching means turns on and the second switching means turns off, the third switching means simultaneously turns on and the fourth switching means simultaneously turns off. As a result, a write current is simultaneously supplied from the first and second current sources to the first coil. When the first switching means turns off and the second switching means turns on, the third switching means simultaneously turns off and the fourth switching means simultaneously turns on. As a result, a write current is supplied from the first current source to the second coil. For this reason, an unbalanced write current flows to the first and second coils. At this time, the fourth switching means has the function of establishing the path of the output current in order to cause the second current source to operate stably.

Furthermore, if the fifth switching means is provided, circuit operation is identical to a case in which the fifth switching means is not connected when the fifth switching means is off, and consequently, the circuit operates identically with the above-described magnetic head drive circuit and an unbalanced write current flows to the first and second coils. When the fifth switching means is on, the third and fourth switching means are always off, and consequently, circuit operation is equivalent to a case in which the third and fourth switching means are absent, and as a result, a balanced write current flows to the first and second coils. Accordingly, the fifth switching means has the function of switching between a balanced and unbalanced write current.

If the first to fifth switching means are NPN bipolar transistors, the third to fifth switching means make up an emitter coupled circuit which takes the second current mirror circuit as a current source. Consequently, if the high level of the base voltage of the fifth switching means is set to a value higher than the high levels of the base voltage of the third and fourth switching means, when the fifth switching means is on, the third and fourth switching means turn off regardless of the level of their base voltages. Accordingly, the write current is supplied from the first current source by way of the first and second switching means, and a balanced write current can be obtained. Operation is the same even if the switching means are N-channel MOS transistors.

The above and other objects, features, and advantages of the present invention will become apparent from the following description based on the accompanying drawings which illustrate an example of a preferred embodiment of the present invention.

DETAILED DESCRIPTION OF THE PREFERRED EMBODIMENTS

Figure 1:
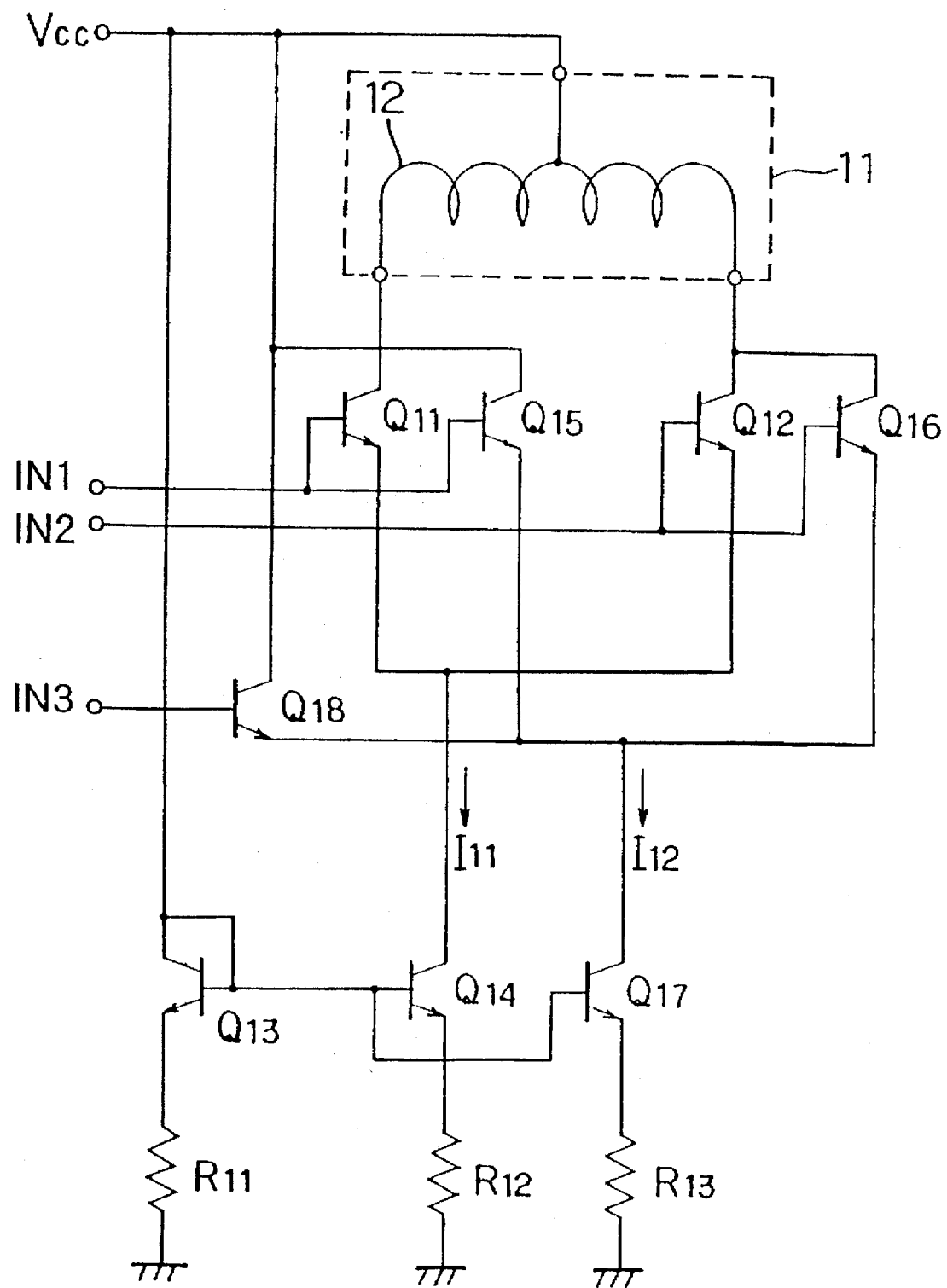
FIG. 1 is a circuit diagram of the magnetic head drive circuit in an embodiment of the present invention.

The construction of a first embodiment of the magnetic head drive circuit of the present invention will be explained with reference to FIG. 1. FIG. 1 is a circuit diagram of the magnetic head drive circuit in an embodiment of the present invention. The circuit of FIG. 1 is a construction having a magnetic recording/playback head 11; NPN bipolar transistors $Q_{11}$ and $Q_{12}$ for determining the direction of the current that flows to the magnetic recording/playback head 11; and current sources constructed from current mirror circuits having NPN bipolar transistors $Q_{13}$, $Q_{14}$, and $Q_{17}$ and resistors $R_{11}$, $R_{12}$ and $R_{13}$ for supplying current that flows to recording/playback coil 12. The current source including $Q_{14}$ and $R_{12}$ is connected to recording/playback coil 12 by way of $Q_{11}$ and $Q_{12}$. The current source including $Q_{14}$ and $R_{12}$ supplies a collector current $I_{11}$. The current source including $Q_{17}$ and $R_{13}$ is connected to drive voltage source $V_{cc}$ through NPN bipolar transistor $Q_{15}$ and is connected to recording/playback coil 12 through NPN bipolar transistor $Q_{16}$. The current source including $Q_{17}$ and $R_{13}$ supplies collector current $I_{12}$. $Q_{15}$ and $Q_{16}$ have the same characteristics. The bases of $Q_{11}$ and $Q_{15}$ are connected to the control signal input terminal IN1, and the bases of $Q_{12}$ and $Q_{16}$ are connected to the control signal input terminal IN2. By means of this construction, the above-described circuit can supply an unbalanced write current to recording/playback coil 12. Furthermore, in order that the above-described circuit can supply a balanced write current to the recording/playback coil 12, NPN bipolar transistor $Q_{18}$ is connected between $V_{cc}$ and the current source including $Q_{17}$ and $R_{13}$. This $Q_{18}$ is on/off controlled by a voltage level impressed to control signal input terminal IN3, thereby enabling switching between a balanced and unbalanced write current.

A high-level voltage impressed to IN3 is set to be higher than the high-level voltage impressed to IN1 and IN2. IN1 and IN2 are terminals that determine the direction of a current that flows to recording/playback coil 12, a high level being inputted to one of the terminals and a low level being inputted to the other terminal.

Next, an explanation will be given of the operation of the magnetic head drive circuit of the first embodiment of the present invention with reference to FIG. 1, first for a case in which an unbalanced write current is supplied to the recording/playback coil 12 and then for a case in which a balanced write current is supplied to the recording/playback coil 12.

To supply an unbalanced write current to the recording/playback coil 12, a case is considered in which a low level is inputted to IN3. In this state, when a high level is inputted to IN1 and a low level is inputted to IN2, $Q_{11}$ and $Q_{15}$ turn on and $Q_{12}$, $Q_{16}$, and $Q_{18}$ turn off. In this state, accordingly, $I_{11}$ is supplied through $Q_{11}$ to the left portion of the recording/playback coil 12, and $I_{12}$ flows through $Q_{15}$ to $V_{cc}$. As a result, $I_{11}$ is supplied to the left portion of recording/playback coil 12.

Next, in a state in which a low level is inputted without alteration to IN3, when a low level is inputted to IN1 and a high level is inputted to IN2, $Q_{12}$ and $Q_{16}$ turn on and $Q_{11}$, $Q_{15}$, and $Q_{18}$ turn off. In this state, accordingly, $I_{11}$ is supplied through $Q_{12}$ to the right portion of recording/playback coil 12, and $I_{12}$ is supplied through $Q_{16}$ to the right portion of recording/playback coil 12. As a result, $(I_{11}+I_{12})$ is supplied to the right portion of recording/playback coil 12.

Figure 5:
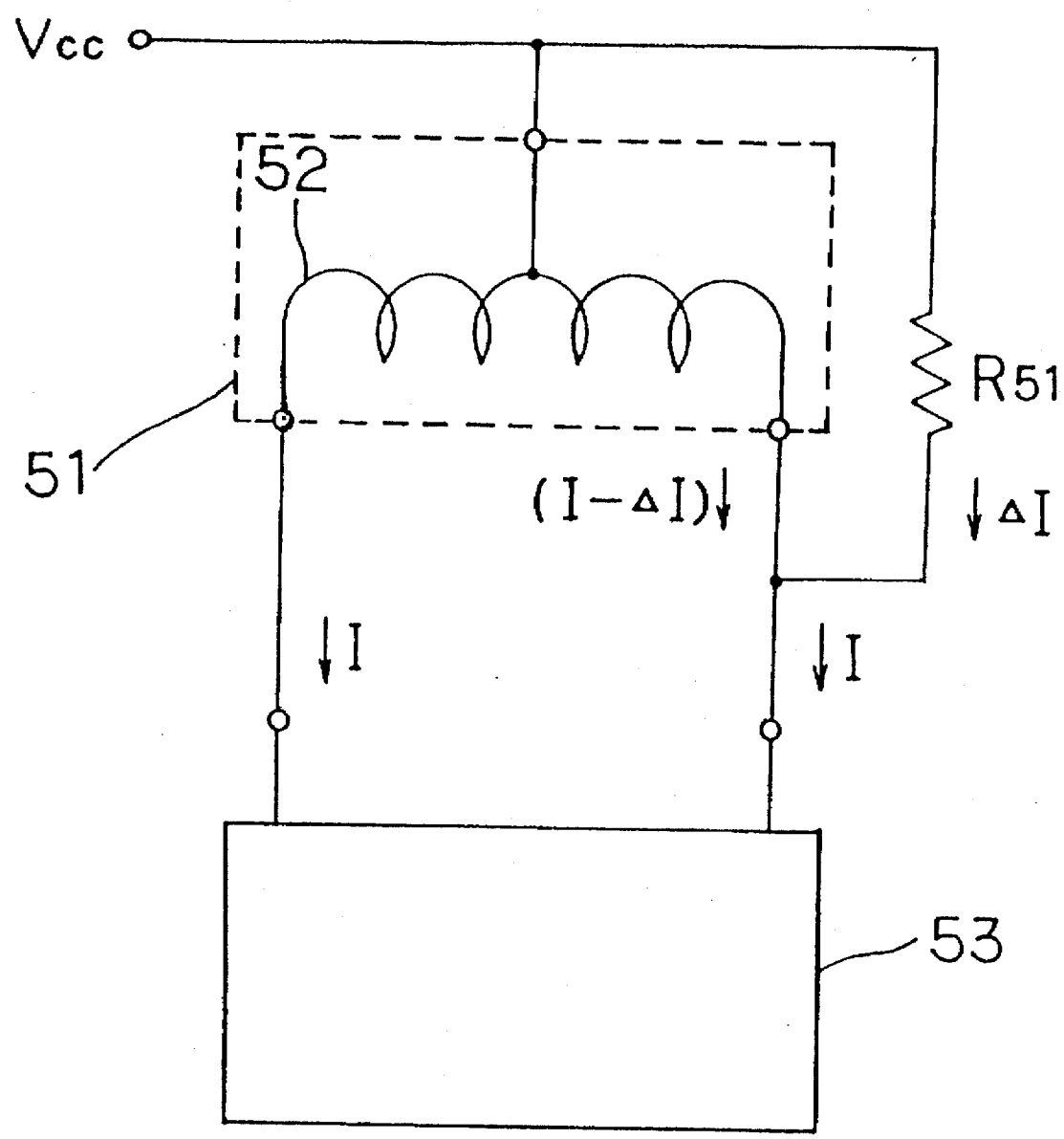
FIG. 5 illustrates a method of supplying an unbalanced write current using a magnetic head drive circuit of the prior art.

As a result of the above-described operation, when a low level is inputted to IN3, $I_{11}$ flows to the left portion of the recording/playback coil 12, and $(I_{11}+I_{12})$ flows to the right portion of the recording/playback coil 12, and consequently, an unbalanced write current is supplied. The variation $\Delta I$ in the unbalanced write current can be represented as:

$$\Delta I/I = r_{12}/r_{13} \qquad 2$$

where $r_{12}$ and $r_{13}$ are the resistance values of $R_{12}$ and $R_{13}$. As can be seen from formula 2, with the construction of the present embodiment, the amount of increase of the write current can clearly be set with a high degree of accuracy as compared with the construction of the prior art example of FIG. 5 and expressed by formula 1. In addition, because formula 2 does not contain the resistance value of the recording/playback coil 12, an unbalanced characteristic can be set with only the internal circuit of the read/write IC regardless of the resistance value of the connected recording/playback coil 12.

To supply a balanced write current to the recording/playback coil 12, a case is considered in which a high level is inputted to IN3. In this state, when a high level is inputted to IN1 and a low level is inputted to IN2, because the electric potential at IN3 is higher than the electric potential at IN1, the base voltage of $Q_{18}$ becomes higher than the base voltage of $Q_{15}$, and $Q_{15}$ turns off and $Q_{18}$ turns on. In this state, accordingly, because $Q_{11}$ and $Q_{18}$ are on and $Q_{12}$, $Q_{15}$, and $Q_{16}$ are off, $I_{11}$ is supplied through $Q_{11}$ to the left portion of the recording/playback coil 12 and $I_{12}$ flows to $V_{cc}$ through $Q_{18}$. As a result, $I_{11}$ is supplied to the left portion of the recording/playback coil 12.

In a state in which a high level is inputted without alteration to IN3, when a low level is inputted to IN1 and a high level is inputted to IN2, because the electric potential at IN3 is higher than the electric potential at IN2, the base voltage of $Q_{18}$ becomes higher than the base voltage of $Q_{16}$, and $Q_{16}$ turns off and $Q_{18}$ turns on. In this state, accordingly, because $Q_{12}$ and $Q_{18}$ are on and $Q_{11}$, $Q_{15}$ and $Q_{16}$ are off, $I_{11}$ is supplied through $Q_{12}$ to the right portion of the recording/playback coil 12, and $I_{12}$ flows through $Q_{18}$ to $V_{cc}$. As a result, $I_{11}$ is supplied to the right portion of the recording/playback coil 12.

As a result of the above-described operation, when a high level is inputted to IN3, $I_{11}$ flows to the left portion of the recording/playback coil 12 and $I_{11}$ flows to the right portion of the recording/playback coil 12, and consequently, a balanced write current is supplied.

Figure 2:
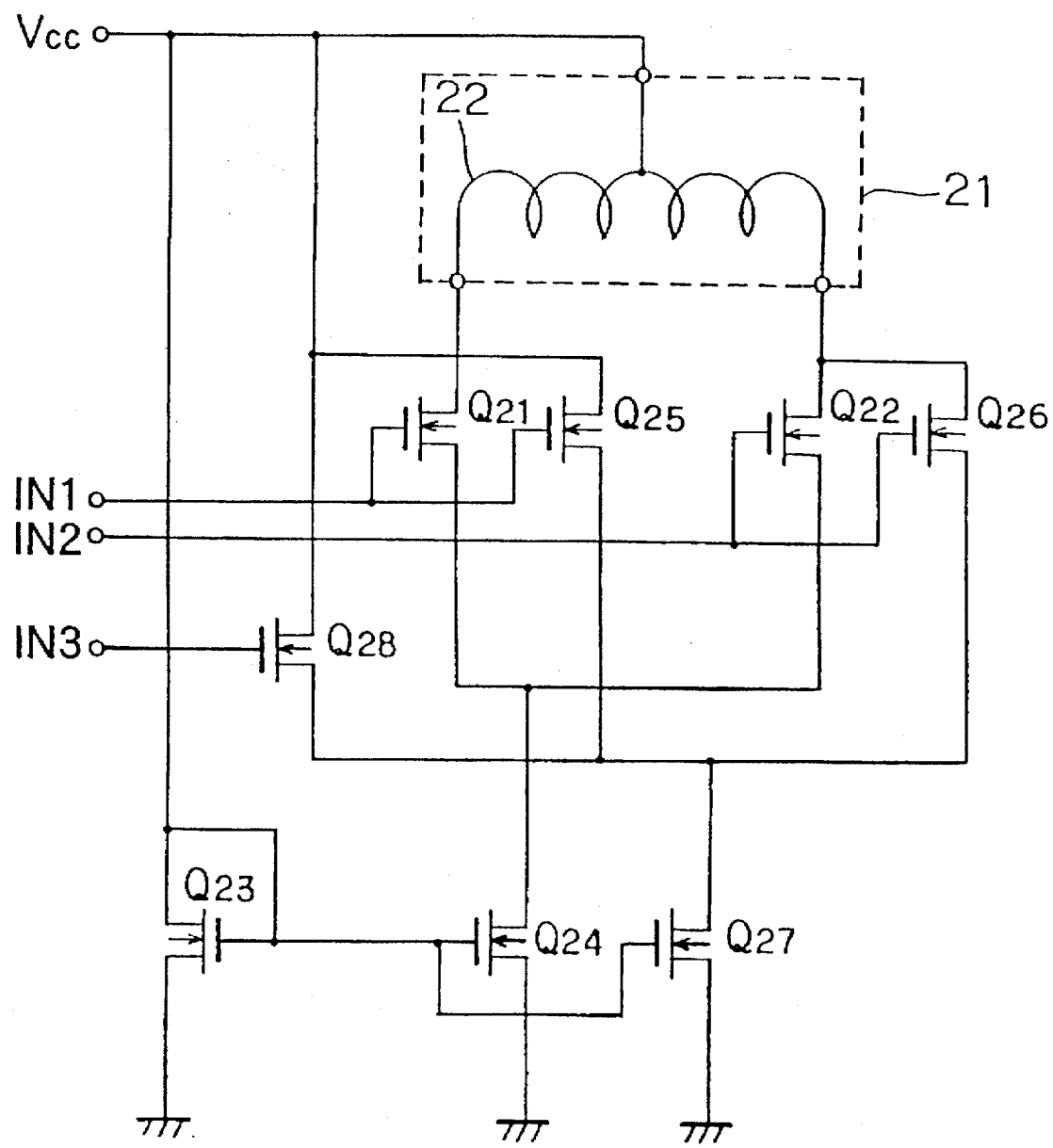
FIG. 2 is a circuit diagram of the magnetic head drive circuit in another embodiment of the present invention.
Figure 3:
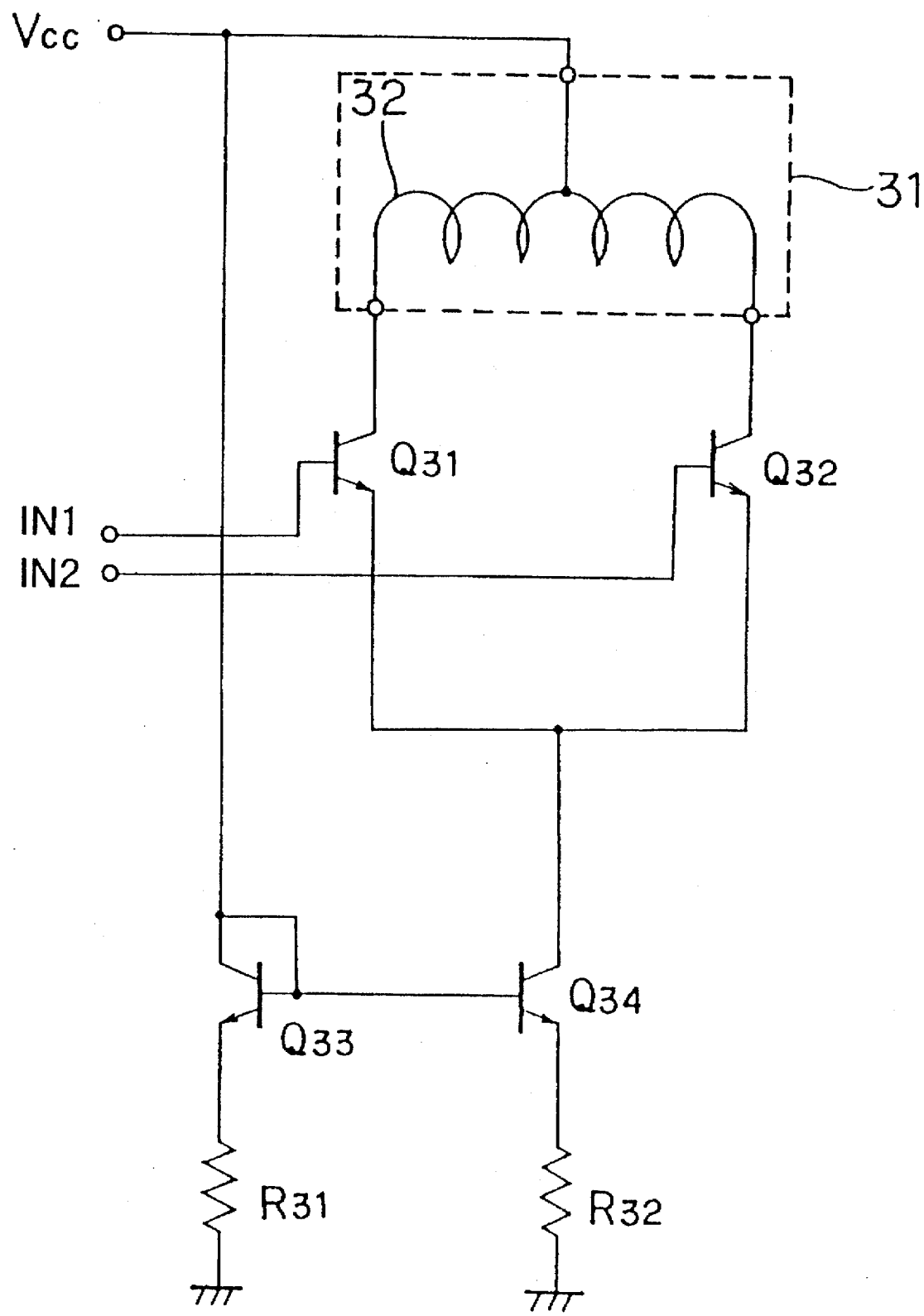
FIG. 3 is circuit diagram of a magnetic head drive circuit in a prior art example.
Figure 4A:
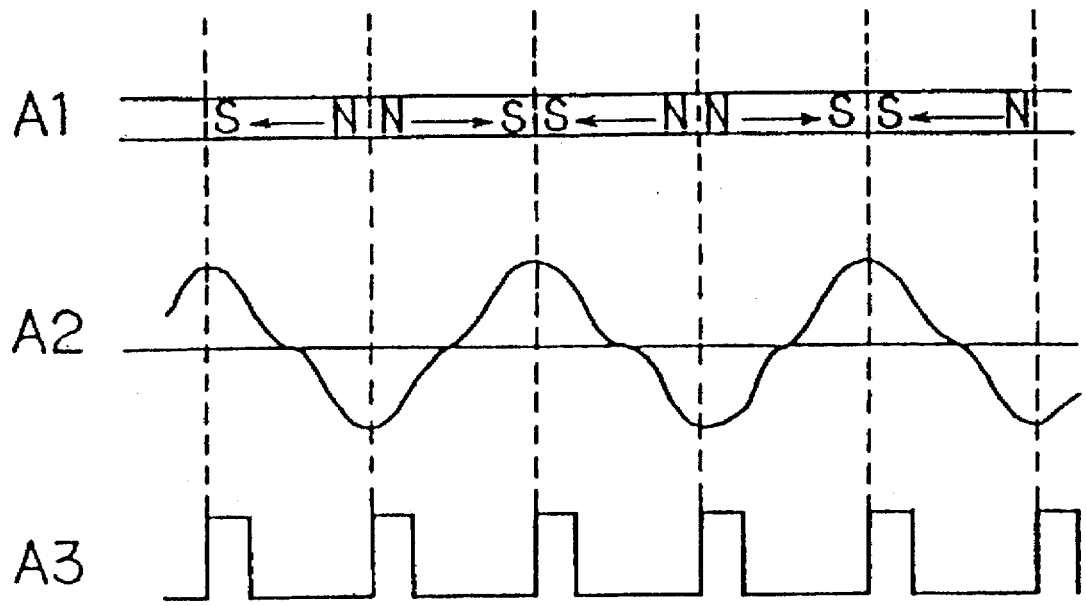
FIGS. 4(A) and 4(B) illustrates bit asymmetry.
Figure 4B:
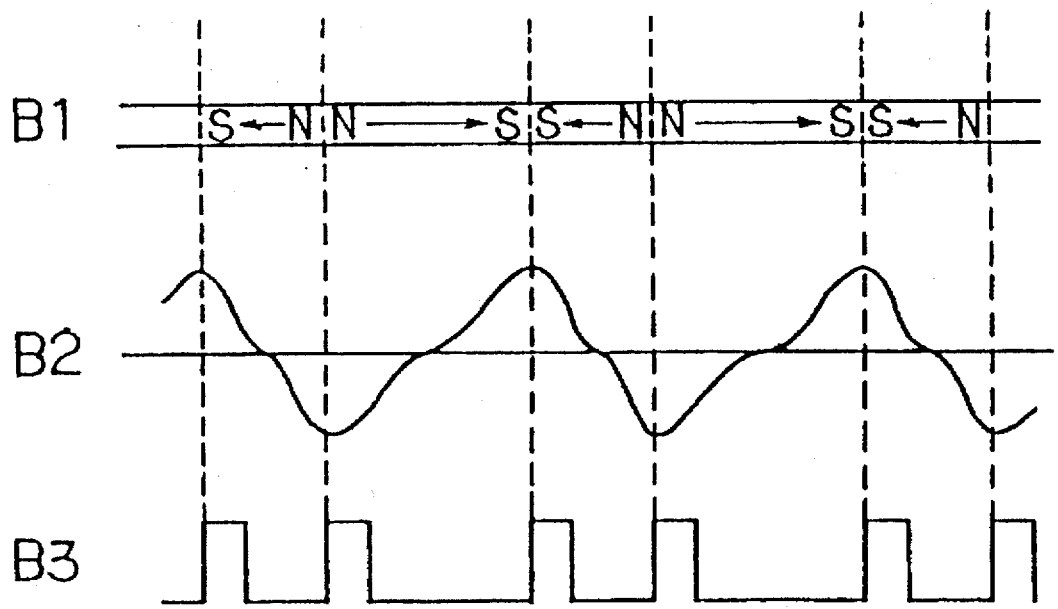

FIG. 2 is a circuit diagram of the magnetic head drive circuit in another embodiment of the present invention. Here, the magnetic recording/playback head 21 corresponds to the magnetic recording/playback head 11 of FIG. 1. N-channel MOS transistors $Q_{21}$, $Q_{22}$, $Q_{25}$, $Q_{26}$ and $Q_{28}$ correspond to the NPN bipolar transistors $Q_{11}$, $Q_{12}$, $Q_{15}$, $Q_{16}$ and $Q_{18}$, respectively, of FIG. 1. N-channel MOS transistors $Q_{23}$, $Q_{24}$, and $Q_{27}$ make up the current sources composed of current mirror circuits and correspond to $Q_{13}$ and $R_{11}$, $Q_{14}$ and $R_{12}$, and $Q_{17}$ and $R_{13}$, respectively, of FIG. 1. The operation principle is equivalent to FIG. 1, whereby the write current supplied to the recording/playback coil 12 can be switched between balanced and unbalanced by on/off switching of $Q_{28}$, which corresponds to $Q_{18}$.

It is to be understood that although the characteristics and advantages of the present invention have been set forth in the foregoing description, the disclosure is illustrative only, and changes may be made in the shape, size, and arrangement of the parts within the scope of the appended claims.

What is claimed is:

1. A magnetic head drive circuit comprising:
   a magnetic recording/playback head including a recording/playback coil divided by a center tap into a first coil and a second coil
   a drive voltage source having one electrode thereof connected with said center tap;
   a first means for supplying a write current to either one of an end of said first coil opposite to said center tap and an end of said second coil opposite to said center tap depending on a logic level of a control signal supplied to the magnetic head drive circuit;
   a second means for supplying an additional current exclusively to said end of said first coil in response to said control signal so that said supplying of the additional current is carried out in synchronization with supplying of said write current to said end of said first coil; and
   control means for generating an additional control signal for prohibiting the supply of said additional current to said end of said first coil regardless of said logic level of said control signal, when said additional control signal is active.

2. The magnetic head drive circuit as claimed in claim 1, wherein the intensity of said additional current supplied from said second means to said first coil is established so as to compensate for leaking of erase flux.

3. The magnetic head drive circuit as claimed in claim 1, wherein said first means comprises:

a first current source for supplying said write current to said recording/playback coil;

first switching means for connecting a current output terminal of said first current source to said end of said first coil in response to said control signal; and second switching means for connecting said current output terminal of said first current source to said end of said second coil in response to an inverted signal of said control signal.

4. The magnetic head drive circuit as claimed in claim 3, wherein said second means comprises:

a second current source for supplying an additional current to said first coil;

third switching means for connecting said end of said first coil to a current output terminal of said second current source in response to said control signal; and fourth switching means for connecting said one electrode of said drive voltage source to said current output terminal of said second current source in response to said inverted control signal.

5. The magnetic head drive circuit according to claim 4, wherein said control means comprises:

fifth switching means for connecting between said one electrode of said drive voltage source and said current output terminal of said second current source in response to said further control signal, wherein, when said additional control signal is made a first logic level to control the fifth switching means to turn off, said third and fourth switching means are placed in an operable state, and when said additional control signal is made an active second logic level to control the fifth switching means to turn on, said third and fourth switching means are placed in an off state regardless of said logic level of said control signal.

6. The magnetic head drive circuit as claimed in claim 5, wherein said first to fifth switching means are all provided with semiconductor elements, and said first and second current sources are provided with first and second current mirror circuits, respectively, which share same current input circuit.

7. The magnetic head drive circuit as claimed in claim 5, wherein said first through fifth switching means are all provided with NPN bipolar transistors, and a high level of said additional control signal is set at a higher value than the high level of said control signal.

8. The magnetic head drive circuit as claimed in claim 5, wherein said first through fifth switching means are all provided with N-channel MOS transistors, and a high level of said additional control signal is set at a higher value than the high level of said control signal.

* * * * *